(12) United States Patent
Ikeno et al.

(10) Patent No.: US 10,166,747 B2
(45) Date of Patent: Jan. 1, 2019

(54) RESIN MULTILAYER SUBSTRATE AND METHOD OF MANUFACTURING THE SAME

(71) Applicant: Murata Manufacturing Co., Ltd., Nagaokakyo-shi, Kyoto-fu (JP)

(72) Inventors: Keisuke Ikeno, Nagaokakyo (JP); Shigeru Tago, Nagaokakyo (JP); Hirohumi Shinagawa, Nagaokakyo (JP); Kuniaki Yosui, Nagaokakyo (JP); Yuki Ito, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/874,021

(22) Filed: Jan. 18, 2018

(65) Prior Publication Data

US 2018/0141321 A1   May 24, 2018

Related U.S. Application Data

(63) Continuation of application No. PCT/JP2016/070018, filed on Jul. 6, 2016.

(30) Foreign Application Priority Data

Aug. 10, 2015   (JP) .................. 2015-158306

(51) Int. Cl.
*H05K 3/46* (2006.01)
*B32B 37/06* (2006.01)
(Continued)

(52) U.S. Cl.
CPC .............. *B32B 37/06* (2013.01); *B32B 37/10* (2013.01); *H05K 3/46* (2013.01); *C09K 19/38* (2013.01);
(Continued)

(58) Field of Classification Search
CPC .......... B32B 37/06; B32B 37/10; H05K 3/46; H05K 2201/0129; H01L 2924/1517;
(Continued)

(56) References Cited

U.S. PATENT DOCUMENTS 5,161,093 A * 11/1992 Gorczyca ............ H01L 21/4857
257/E23.077
5,179,777 A *  1/1993 Suzuki ................. H05K 3/4655
29/830

(Continued)

FOREIGN PATENT DOCUMENTS

JP       49-51561 A    5/1974
JP       03-88388 A    4/1991
(Continued)

OTHER PUBLICATIONS

Official Communication issued in International Patent Application No. PCT/JP2016/070018, dated Aug. 2, 2016.

*Primary Examiner* — Earl Taylor
(74) *Attorney, Agent, or Firm* — Keating & Bennett, LLP (57) ABSTRACT

A resin multilayer substrate includes insulating base materials integrated by thermocompression bonding and each including a thermoplastic resin as a main material. The insulating base materials include a first insulating base material with a first conductor pattern thereon, and a second insulating base material with a second conductor pattern thereon. The second insulating base material, an intermediate resin material layer, and the first insulating base material are stacked in this order. The intermediate resin material layer includes an intermediate region and an end region in contact with the surface on a first side of the second conductor pattern. The surface on the first side of the intermediate resin material layer is in contact with the first insulating base material, and, when seen in plan view, the (Continued)

first conductor pattern extends over the intermediate region and the end region.

20 Claims, 5 Drawing Sheets

(51) Int. Cl.
 *B32B 37/10* (2006.01)
 *H01L 23/538* (2006.01)
 *C09K 19/38* (2006.01)

(52) U.S. Cl.
 CPC .. *H01L 23/5383* (2013.01); *H05K 2201/0129* (2013.01)

(58) Field of Classification Search
 CPC . H01L 2924/15174; H01L 2924/15184; H01L 23/49822; H01L 21/4857; H01L 23/5383
 See application file for complete search history.

(56) References Cited

U.S. PATENT DOCUMENTS

| | | | | |
|---|---|---|---|---|
| 8,604,349 | B2* | 12/2013 | Sakai | H05K 3/4617 |
| | | | | 174/255 |
| 2006/0267159 | A1* | 11/2006 | Yamamoto | H01L 23/3121 |
| | | | | 257/659 |
| 2015/0294754 | A1* | 10/2015 | Ohata | H05K 3/4632 |
| | | | | 428/195.1 |
| 2015/0305150 | A1 | 10/2015 | Ohata | |
| 2016/0270221 | A1* | 9/2016 | Otsubo | H01L 24/23 |
| 2018/0141321 | A1* | 5/2018 | Ikeno | H05K 3/46 |

FOREIGN PATENT DOCUMENTS

| | | | | |
|---|---|---|---|---|
| JP | 04-278598 | A | 10/1992 | |
| JP | 2004343054 | A * | 12/2004 | B23B 15/08 |
| WO | 2014/109139 | A1 | 7/2014 | |
| WO | 2014/188830 | A1 | 11/2014 | |

* cited by examiner

RESIN MULTILAYER SUBSTRATE AND METHOD OF MANUFACTURING THE SAME

CROSS REFERENCE TO RELATED APPLICATIONS

This application claims the benefit of priority to Japanese Patent Application No. 2015-158306 filed on Aug. 10, 2015 and is a Continuation Application of PCT Application No. PCT/JP2016/070018 filed on Jul. 6, 2016. The entire contents of each application are hereby incorporated herein by reference.

BACKGROUND OF THE INVENTION

1. Field of the Invention

The present invention relates to a resin multilayer substrate and a method of manufacturing the same.

2. Description of the Related Art

WO2014/109139 describes a resin multilayer substrate including a paint layer formed by applying a thermoplastic resin paint and placed between conductor patterns, so as to eliminate a difference in level which would arise on a stacked body as a whole due to presence and absence of a conductor pattern.

For example, suppose that a resin layer B is laid on the upper side of a resin layer A in a resin multilayer substrate. Suppose that resin layer A and resin layer B both have respective conductor patterns on their respective upper surfaces and that these conductor patterns partially overlap each other when seen in plan view. If the paint layer for eliminating a difference in level is placed at a region of the upper surface of resin layer A with no conductor pattern, it is difficult to completely eliminate a gap between the paint layer and the conductor pattern in relation with, for example, positional accuracy. The term "a gap between the paint layer and the conductor pattern" here refers to a gap appearing when seen in plan view. If such a gap is present, the resin layer B laid on their upper side deforms so as to be disposed into the gap at the time of thermocompression bonding. At this time, the conductor pattern on the upper surface of resin layer B may also deform downward and be deflected into this gap. As a result, a short circuit may occur through contact between the conductor patterns vertically adjacent to each other, i.e., between the conductor pattern on the upper surface of resin layer A and the conductor pattern on the upper surface of resin layer B.

SUMMARY OF THE INVENTION

Preferred embodiments of the present invention provide resin multilayer substrates that prevent a short circuit between conductor patterns vertically adjacent to each other.

A resin multilayer substrate according to a preferred embodiment of the present invention includes a plurality of insulating base materials in sheet form that are stacked in a stacking direction and integrated together by thermocompression bonding, the stacking direction being a direction connecting a first side and a second side opposite to the first side, each insulating base material including a thermoplastic resin as a main material and including a main surface on the first side and a main surface on the second side. The plurality of insulating base materials include a first insulating base material including a first conductor pattern provided on the main surface on the first side, and a second insulating base material including a second conductor pattern provided on the main surface on the first side. The second insulating base material, an intermediate resin material layer with no conductor pattern, and the first insulating base material are stacked in this order from the second side to the first side. The intermediate resin material layer includes an intermediate region whose surface on the second side is in contact with the main surface of the first side of the second insulating base material, and an end region whose surface on the second side is in contact with a surface on the first side of the second conductor pattern. A surface on the first side of the intermediate resin material layer is in contact with the main surface on the second side of the first insulating base material. When seen in plan view, the first conductor pattern extends over the intermediate region and the end region.

According to preferred embodiments of the present invention, a short circuit between the first conductor pattern and the second conductor pattern is prevented, with suitable interposition of the intermediate resin material layer.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The scale ratios shown in the drawings are not necessarily true and actual ratios but may be shown exaggeratedly for the purpose of illustration. In the description below, when reference is made to the concept of "upper" or "lower", it does not mean absolute "upper" or "lower" but means relative "upper" or "lower" with respect to the postures in the drawings.

Preferred Embodiment 1

Figure 1:
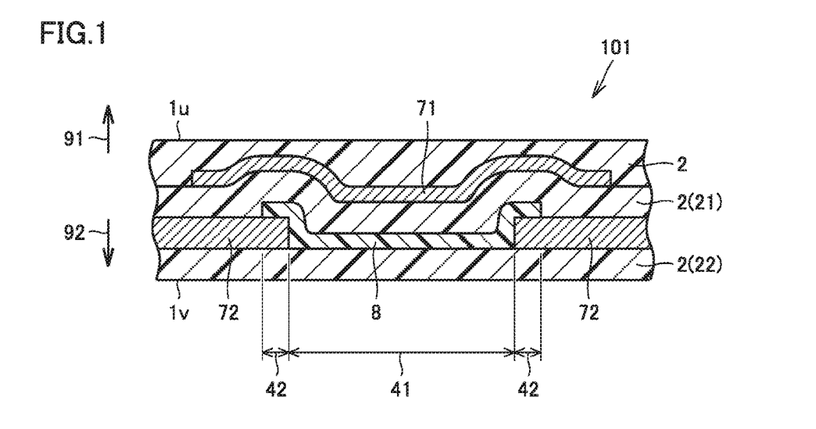
FIG. 1 is a cross-sectional view of a resin multilayer substrate according to Preferred Embodiment 1 of the present invention.
Figure 2:
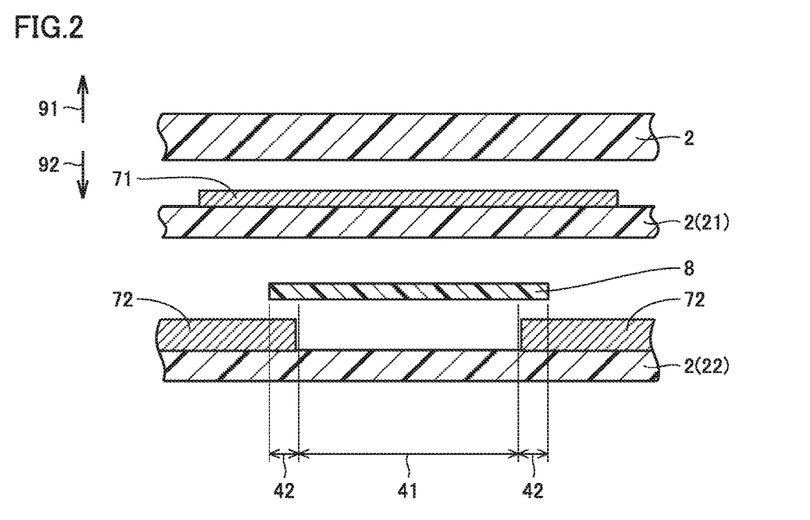
FIG. 2 is an exploded view of the resin multilayer substrate according to Preferred Embodiment 1 of the present invention.

With reference to FIGS. 1 and 2, a resin multilayer substrate 101 according to Preferred Embodiment 1 of the present invention is described. A cross-sectional view of resin multilayer substrate 101 is shown in FIG. 1, and an exploded view thereof is shown in FIG. 2.

Resin multilayer substrate 101 in the present preferred embodiment is a resin multilayer substrate obtained by stacking a plurality of insulating base materials 2 in sheet form in a stacking direction and integrating them together by thermocompression bonding, the stacking direction being the direction connecting a first side 91 and a second side 92 opposite to first side 91, each insulating base material 2 including a thermoplastic resin as a main material and including a main surface on first side 91 and a main surface on second side 92. A thermoplastic resin as a main material of insulating base material 2 may preferably be, for example, a liquid-crystal polymer resin (also referred to as an "LCP resin"). A plurality of insulating base materials 2 include a first insulating base material 21 including a first conductor pattern 71 provided on the main surface on first side 91, and a second insulating base material 22 including a second conductor pattern 72 provided on the main surface on first side 91. Each of first conductor pattern 71 and second conductor pattern 72 is, for example, a metallic film. The metallic film here may be a metallic foil. The metallic foil here may preferably be, for example, a copper foil. In resin multilayer substrate 101, second insulating base material 22, an intermediate resin material layer 8 with no conductor pattern, and first insulating base material 21 are stacked in this order from second side 92 to first side 91. Intermediate resin material layer 8 includes an intermediate region 41 whose surface on second side 92 is in contact with the main surface on the first side of second insulating base material 22, and an end region 42 whose surface on second side 92 is in contact with the surface on first side 91 of second conductor pattern 72. The surface on first side 91 of intermediate resin material layer 8 is in contact with the main surface on second side 92 of first insulating base material 21. When seen in plan view, first conductor pattern 71 extends over intermediate region 41 and end region 42. Resin multilayer substrate 101 includes outermost surfaces 1u, 1v. Intermediate resin material layer 8 is a resin layer that prevents a difference in level which would arise on outermost surfaces 1u, 1v due to a difference in distribution of the conductor patterns. Therefore, intermediate resin material layer 8 may be also referred to as a resin layer that eliminates a difference in level. Intermediate resin material layer 8 may preferably be the same type of sheet thermoplastic resin base material as first insulating base material 21 and second insulating base material 22. Intermediate resin material layer 8, which is a resin layer with no conductor pattern, may be provided with an interlayer connecting conductor, such as a via-hole conductor, to electrically connect the surface on first side 91 and the surface on second side 92 of intermediate resin material layer 8 to each other.

In the present preferred embodiment, intermediate resin material layer 8 is provided between second insulating base material 22 and first insulating base material 21. Also, intermediate resin material layer 8 includes intermediate region 41 whose surface on second side 92 is in contact with the main surface on the first side of second insulating base material 22, and includes end region 42 whose surface on second side 92 is in contact with second conductor pattern 72. Thus, when seen in plan view, there is no gap between intermediate resin material layer 8 and second conductor pattern 72. Therefore, a short circuit is able to be prevented between the conductor patterns vertically adjacent to each other, i.e., between first conductor pattern 71 and second conductor pattern 72. Further, since intermediate resin material layer 8 includes end region 42 whose surface on second side 92 is in contact with the surface on first side 91 of second conductor pattern 72, first conductor pattern 71 is displaced so as to be elevated to first side 91 in the region where first conductor pattern 71 overlaps end region 42. Therefore, a short circuit between first conductor pattern 71 and second conductor pattern 72 is able to be further reliably prevented.

Preferred Embodiment 2

Figure 3:
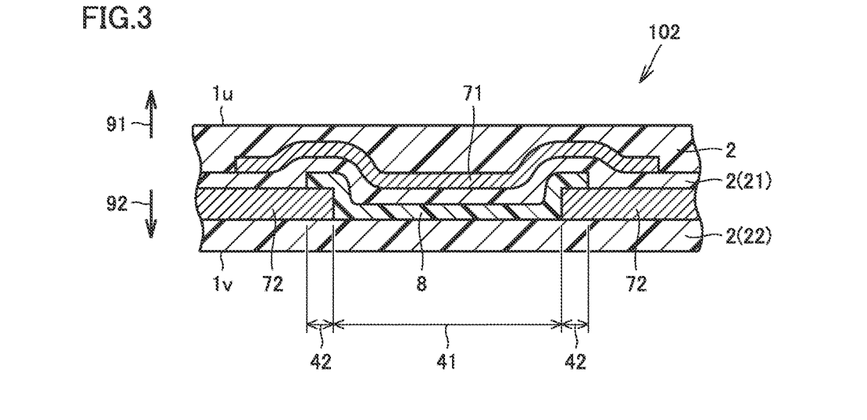
FIG. 3 is a cross-sectional view of a resin multilayer substrate according to Preferred Embodiment 2 of the present invention.
Figure 4:
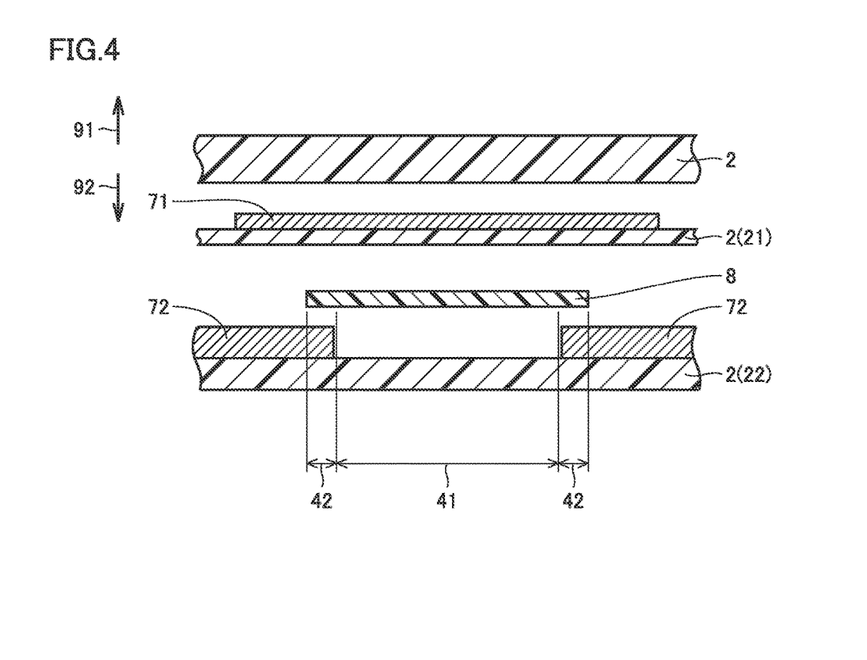
FIG. 4 is an exploded view of the resin multilayer substrate according to Preferred Embodiment 2 of the present invention.

With reference to FIGS. 3 and 4, a resin multilayer substrate 102 according to Preferred Embodiment 2 of the present invention is described. A cross-sectional view of resin multilayer substrate 102 is shown in FIG. 3, and an exploded view thereof is shown in FIG. 4. The basic configuration of resin multilayer substrate 102 is the same as that of resin multilayer substrate 101 described in Preferred Embodiment 1. Resin multilayer substrate 102 is different from resin multilayer substrate 101 in the following respects.

In resin multilayer substrate 102, first insulating base material 21 is thinner than second insulating base material 22.

The configuration of the present preferred embodiment where first insulating base material 21 is thinner than second insulating base material 22 would be likely to cause a short circuit between first conductor pattern 71 and second conductor pattern 72 under ordinary circumstances. However, since intermediate resin material layer 8 is provided between second insulating base material 22 and first insulating base material 21, and since intermediate resin material layer 8 includes intermediate region 41 whose surface on second side 92 is in contact with the main surface of second insulating base material 22, and includes end region 42 whose surface on second side 92 is in contact with second conductor pattern 72, a short circuit is able to be prevented between the conductor patterns vertically adjacent to each other, i.e., between first conductor pattern 71 and second conductor pattern 72. Further, the effect of preventing a short circuit is more reliably obtained.

Note that, in each Preferred Embodiment, first insulating base material 21 is preferably the thinnest of a plurality of insulating base materials 2. By providing intermediate resin material layer 8 at an area of and immediately under first insulating base material 21 that is the thinnest of a plurality of insulating base materials 2 defining the stacked body, a short circuit which would be likely to occur under ordinary circumstances is effectively prevented. There may be a plurality of insulating base materials that are the thinnest of a plurality of insulating base materials 2. In the case in which there are a plurality of thinnest insulating base materials, first insulating base material 21 may be one of the thinnest insulating base materials.

Note that, in each Preferred Embodiment, second conductor pattern 72 is preferably thicker than first insulating base material 21. In such a case, as well, a portion of first insulating base material 21 that is laid over an end of second conductor pattern 72 largely deforms, which would be likely to cause a short circuit between the conductor patterns. However, by providing intermediate resin material layer 8 immediately under first insulating base material 21, a short circuit is effectively prevented.

Note that, in each Preferred Embodiment, the main material of intermediate resin material layer 8 is preferably of the same type as the main material of a plurality of insulating base materials 2. For example, if the main material of insulating base materials 2 is an LCP resin, it is preferable that the main material of intermediate resin material layer 8 also be an LCP resin. By being of the same type, they have excellent adhesion with one another.

Note that, in each Preferred Embodiment, when seen in plan view, in at least a portion of the region in which first conductor pattern 71 overlaps second conductor pattern 72, intermediate resin material layer 8 preferably overlaps second conductor pattern 72. Such a configuration is able to more effectively prevent, with the presence of intermediate resin material layer 8, a short circuit between the conductor patterns.

Preferred Embodiment 3

Figure 5:
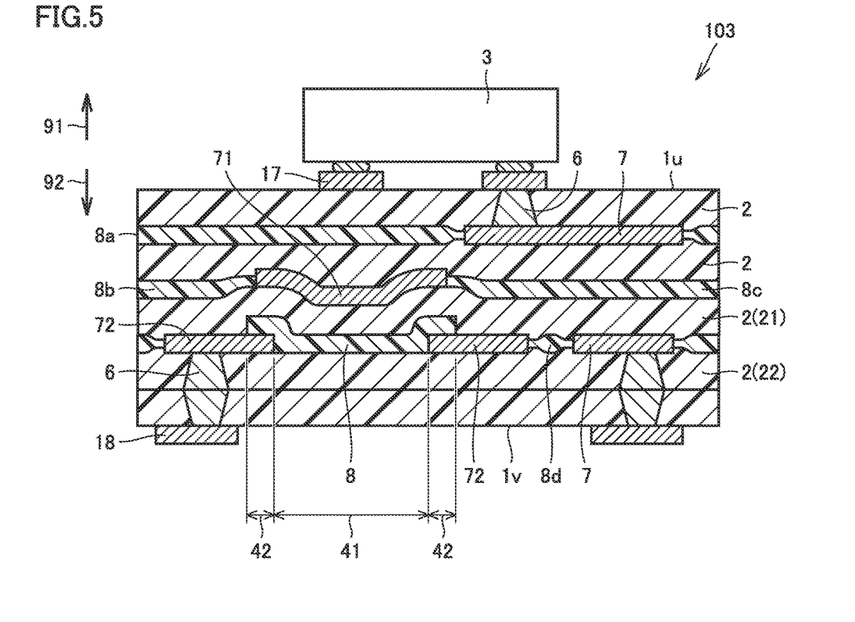
FIG. 5 is a cross-sectional view of a resin multilayer substrate according to Preferred Embodiment 3 of the present invention.
Figure 6:
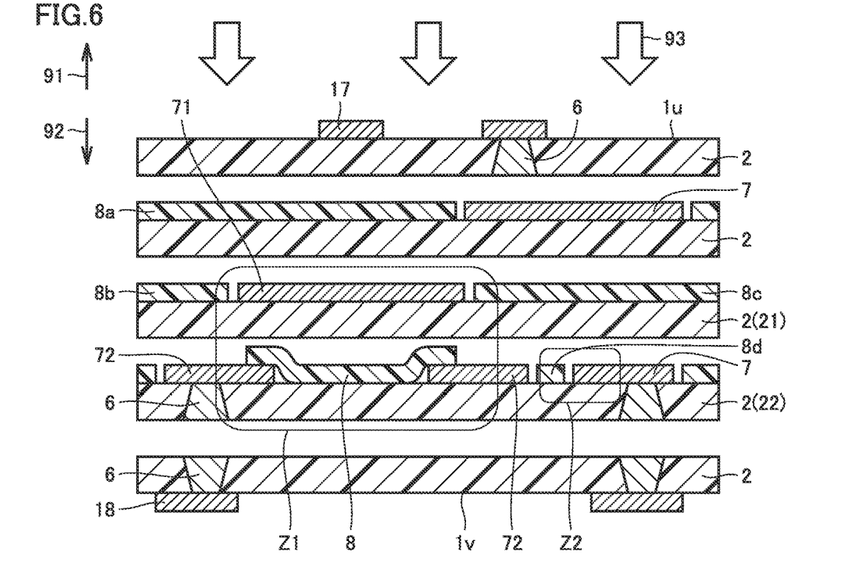
FIG. 6 is an exploded view of the resin multilayer substrate according to Preferred Embodiment 3 of the present invention.

With reference to FIGS. 5 and 6, a resin multilayer substrate 103 according to Preferred Embodiment 3 of the present invention is described. A cross-sectional view of resin multilayer substrate 103 is shown in FIG. 5, and an exploded view thereof is shown in FIG. 6. In FIG. 6, a surface-mount device 3 is not shown. The basic configuration of resin multilayer substrate 103 is the same or substantially the same as that of resin multilayer substrate 101 described in Preferred Embodiment 1. Resin multilayer substrate 103 is different from resin multilayer substrate 101 in the following respects.

Resin multilayer substrate 103 includes one or more outside electrodes on the outermost surface on first side 91 or on second side 92. The term "one or more outside electrodes" here includes outside electrodes 17, 18. In the example shown in FIG. 5, outside electrode 17 is provided on the outermost surface on first side 91, and outside electrode 18 is provided on the outermost surface on second side 92. When seen in plan view, outside electrodes 17, 18 as "one or more outside electrodes" are located so as to avoid a boundary portion between intermediate region 41 and end region 42. As shown in FIG. 5, resin multilayer substrate 103 may include surface-mount device 3. In the example shown in FIG. 5, surface-mount device 3 is mounted via outside electrode 17 provided on outermost surface 1u. Similarly, another surface-mount device may be mounted via outside electrode 18 provided on lowest surface 1v.

In the example shown in FIG. 5, in an area in which conductor patterns of vertically adjacent layers overlap each other, an end portion of intermediate resin material layer 8 covers the lower one of the conductor patterns. However, in an area in which conductor patterns of vertically adjacent layers do not overlap each other, an end portion of intermediate resin material layer 8 does not cover a conductor pattern.

In the example shown in FIG. 5, resin multilayer substrate 103 includes some conductor patterns 7 in addition to first conductor pattern 71 and second conductor pattern 72. In resin multilayer substrate 103, some conductor patterns are connected to each other via interlayer connecting conductors 6, or some conductor patterns and outside electrodes are connected to each other via interlayer connecting conductors 6.

FIG. 6 shows individual insulating base materials 2 separately. All of these insulating base materials 2 are integrated together by being stacked and then being subjected to heat and pressure. The integration may be done by applying a pressure as indicated by an arrow 93. The application of heat and pressure causes thermocompression bonding between a plurality of insulating base materials 2. They are integrated together into a resin multilayer substrate by the thermocompression bonding. Resin multilayer substrate 103 having the configuration shown in FIG. 5 is obtained by additionally mounting surface-mount device 3 on the integrated body.

Since an end portion of intermediate resin material layer 8 lies on the upper side of second conductor pattern 72 at end region 42, a difference in level may locally arise on outermost surfaces 1u, 1v. In the present preferred embodiment, however, even if a difference in level locally arises on outermost surfaces 1u, 1v, the influences thereof are avoided because outside electrodes 17, 18 are located so as to avoid end region 42. Therefore, a surface-mount device is able to be mounted satisfactorily.

In each Preferred Embodiment, intermediate resin material layer 8 may be formed in various ways. As a first option, intermediate resin material layer 8 is preferably in sheet form. By using such a configuration, intermediate resin material layer 8 may be formed by stacking and is thus easy to handle. As a second option, intermediate resin material layer 8 is preferably made of a paste. By adopting such a configuration, intermediate resin material layer 8 may be formed by application and thus may be easily formed at a desired region and may be easily formed to be a thin layer.

As shown in FIG. 6, in a Z1 portion, in which the conductor patterns of the layers vertically adjacent to each other overlap each other, an end portion of intermediate resin material layer 8 is laid over the lower one of the conductor patterns (second conductor pattern 72 in this case), thus preventing a short circuit between first conductor pattern 71 and second conductor pattern 72, with intermediate resin material layer 8 being interposed between the conductor patterns. In a Z2 portion, however, the conductor patterns of the layers vertically adjacent to each other do not overlap each other, and thus there is an inherently low possibility of short circuit between the conductor patterns. At such an area as Z2 portion, in order not to create an unwanted difference in level on outermost surfaces 1u, 1v, it is preferable not to lay an end portion of intermediate resin material layer 8 (8a-8d) over the lower one of the conductor patterns. This may be expressed as follows. Resin multilayer substrate 103 is a resin multilayer substrate obtained by stacking a plurality of insulating base materials 2 in a stacking direction and integrating them together by thermocompression bonding, the stacking direction being the direction connecting first side 91 and second side 92 opposite to first side 91, each insulating base material 2 including a thermoplastic resin as a main material and including a main surface on first side 91 and a main surface on second side 92. Two or more of the plurality of insulating base materials 2 each include a conductor pattern provided on the main surface on first side 91. In at least a portion of an area in which the conductor patterns of two insulating base materials 2 adjacent to each other in the stacking direction overlap each other, intermediate resin material layer 8 is provided between the conductor patterns, with an end portion of intermediate resin material layer 8 covering an end of the lower one of the conductor patterns. In at least a portion of an area in which the conductor patterns of two insulating base materials 2 adjacent to each other in the stacking direction do not overlap each other, intermediate resin material layer 8 is provided between the conductor patterns, with an end portion of intermediate resin material layer 8 not covering an end of the lower one of the conductor patterns.

Preferred Embodiment 4

Figure 7:
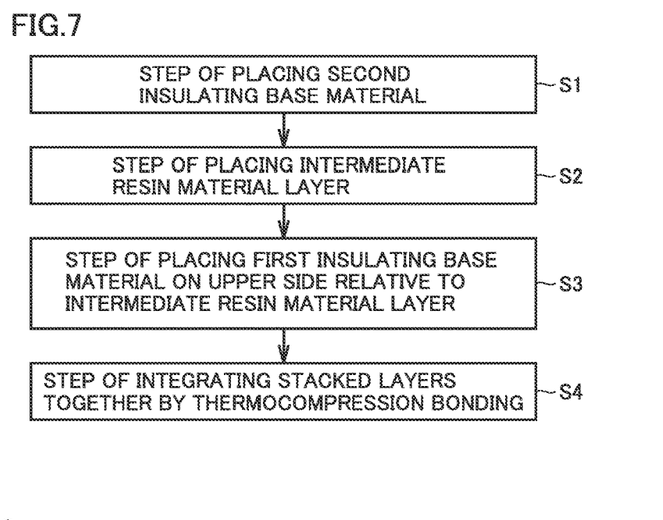
FIG. 7 is a flowchart for a method of manufacturing a resin multilayer substrate according to Preferred Embodiment 4 of the present invention.
Figure 8:
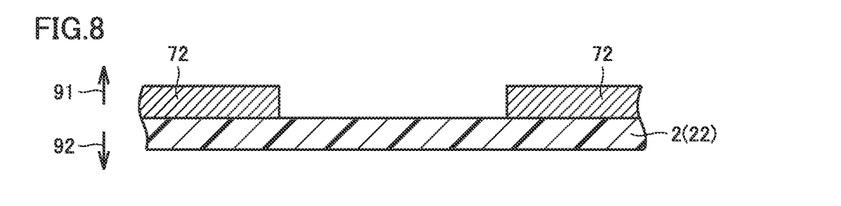
FIG. 8 is an illustrative diagram of a first step of the method of manufacturing a resin multilayer substrate according to Preferred Embodiment 4 of the present invention.
Figure 9:
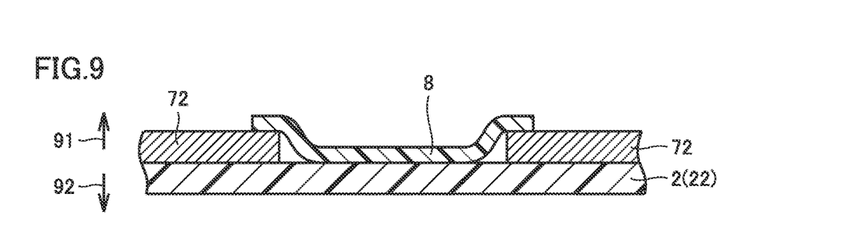
FIG. 9 is an illustrative diagram of a second step of the method of manufacturing a resin multilayer substrate according to Preferred Embodiment 4 of the present invention.
Figure 10:
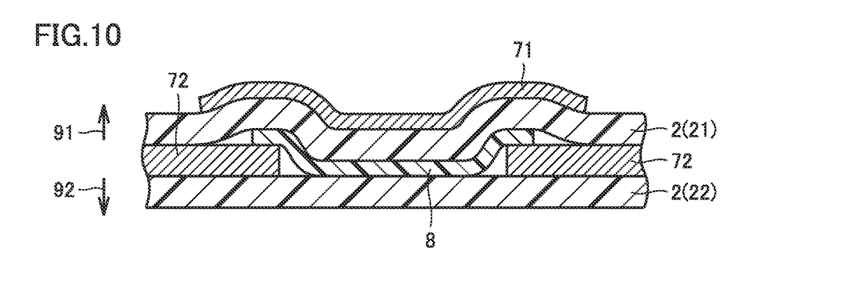
FIG. 10 is an illustrative diagram of a third step of the method of manufacturing a resin multilayer substrate according to Preferred Embodiment 4 of the present invention.

With reference to FIGS. 1, 2, and 7-10, a method of manufacturing a resin multilayer substrate according to Preferred Embodiment 4 of the present invention is described. A flowchart for the method of manufacturing a resin multilayer substrate in the present preferred embodiment is shown in FIG. 7. In the method of manufacturing a resin multilayer substrate in the present preferred embodiment, the layers as shown in FIG. 2 are stacked in a way as described below.

The method of manufacturing a resin multilayer substrate according to the present preferred embodiment is a method of manufacturing a resin multilayer substrate by stacking a plurality of insulating base materials 2 in sheet form in a stacking direction, the stacking direction being the direction connecting first side 91 and second side 92 opposite to first side 91, each insulating base material 2 including a thermoplastic resin as a main material and including a main surface on first side 91 and a main surface on second side 92. The method includes a step S1 of placing second insulating base material 22 with the first side 91 facing upward, second insulating base material 22 including second conductor pattern 72 formed on the main surface on first side 91 (see FIG. 8), a step S2 of placing intermediate resin material layer 8 on the upper side of second insulating base material 22 (see FIG. 9), a step S3 of placing first insulating base material 21 on the upper side relative to intermediate resin material layer 8, first insulating base material 21 including first conductor pattern 71 formed on the main surface on first side 91 (see FIG. 10), and a step S4 of integrating the stack of second insulating base material 22, intermediate resin material layer 8, and first insulating base material 21 together by thermocompression bonding after step S3 of placing first insulating base material 21. Intermediate resin material layer 8 includes intermediate region 41 whose surface on second side 92 is in contact with the main surface on the first side of second insulating base material 22, and end region 42 whose surface on second side 92 is in contact with the surface on first side 91 of second conductor pattern 72. After step S3 of placing first insulating base material 21, the surface on first side 91 of intermediate resin material layer 8 is in contact with the main surface on second side 92 of first insulating base material 21. At step S3 of placing first insulating base material 21, first insulating base material 21 is placed so that first conductor pattern 71 extends over intermediate region 41 and end region 42 when seen in plan view. Thus, resin multilayer substrate 101 as shown in FIG. 1 is obtained.

The present preferred embodiment includes step S2 of placing the intermediate resin material layer on the upper side of the second insulating base material. Further, in the present preferred embodiment, as a state after step S3 of placing first insulating base material 21, the surface on first side 91 of intermediate resin material layer 8 is in contact with the main surface on second side 92 of first insulating base material 21, and first conductor pattern 71 extends over intermediate region 41 and end region 42. Thus, a short circuit between the conductor patterns vertically adjacent to each other, i.e., first conductor pattern 71 and second conductor pattern 72, is able to be prevented with the presence of intermediate resin material layer 8.

In the method of manufacturing a resin multilayer substrate according to the present preferred embodiment, first insulating base material 21 is preferably thinner than second insulating base material 22. The configuration in which first insulating base material 21 is thinner than second insulating base material 22 would be likely to cause a short circuit between first conductor pattern 71 and second conductor pattern 72 under ordinary circumstances. However, since intermediate resin material layer 8 is provided between second insulating base material 22 and first insulating base material 21 in the manufacturing method in the present preferred embodiment, a short circuit is prevented.

In the method of manufacturing a resin multilayer substrate in the present preferred embodiment, first insulating base material 21 is preferably the thinnest of a plurality of insulating base materials 2. In the manufacturing method in the present preferred embodiment, by placing intermediate resin material layer 8 immediately under first insulating base material 21, a short circuit which would be likely to occur under ordinary circumstances is effectively prevented.

In the method of manufacturing a resin multilayer substrate according to the present preferred embodiment, second conductor pattern 72 is preferably thicker than first insulating base material 21. In such a case as well, a portion of first insulating base material 21 that is laid over an end of second conductor pattern 72 largely deforms, which would be likely to cause a short circuit between the conductor patterns. However, in the manufacturing method according to the present preferred embodiment, by placing intermediate resin material layer 8 immediately under first insulating base material 21, a short circuit is effectively prevented.

In the method of manufacturing a resin multilayer substrate according to the present preferred embodiment, the main material of intermediate resin material layer 8 is preferably of the same type as the main material of a plurality of insulating base materials 2. In such a case, they have excellent adhesion with one another by being of the same type.

In the method of manufacturing a resin multilayer substrate according to the present preferred embodiment, after step S3 of placing first insulating base material 21, in at least a portion of the region in which first conductor pattern 71 overlaps second conductor pattern 72, intermediate resin material layer 8 overlaps second conductor pattern 72, when seen in plan view. Since they overlap in such a manner after step S3, a short circuit between the conductor patterns is effectively prevented with the presence of intermediate resin material layer 8.

As shown in FIG. 6, preferably included is a step of placing insulating base material 2 including one or more outside electrodes 17, 18 on the main surface on first side 91 or on second side 92, so that one or more outside electrodes 17, 18 are exposed on the outermost surface of the stacked body. Further, one or more outside electrodes 17, 18 are preferably arranged so as to avoid a boundary portion between intermediate region 41 and end region 42 when seen in plan view. Since an end portion of intermediate resin material layer 8 lies on the upper side of second conductor pattern 72 at the boundary portion between intermediate region 41 and end region 42, a difference in level may locally arise on outermost surfaces 1u, 1v. In the manufacturing method according to the present preferred embodiment, however, even if a difference in level locally arises on outermost surfaces 1u, 1v due to end region 42, the influences thereof are able to be avoided because outside electrodes 17, 18 are located so as to avoid the boundary portion between intermediate region 41 and end region 42. Therefore, a surface-mount device is able to be mounted satisfactorily. There is a case in which the resin multilayer substrate is mounted on a printed-circuit board through outermost surface 1v, the lower surface in FIG. 6. In such a case as well, mounting on a printed-circuit board is able to be satisfactorily performed by avoiding the influences of a local difference in level.

Step S2 of placing intermediate resin material layer 8 preferably includes a step of placing a layer in sheet form. If intermediate resin material layer 8 is placed by placing such a layer in sheet form, intermediate resin material layer 8 is able to be formed by stacking and is thus easy to handle.

Step S2 of placing intermediate resin material layer 8 preferably includes a step of forming intermediate resin material layer 8 by applying a paste. If intermediate resin material layer 8 is formed by such application, intermediate resin material layer 8 can be easily formed at a desired region.

Preferred Embodiment 5

Figure 11:
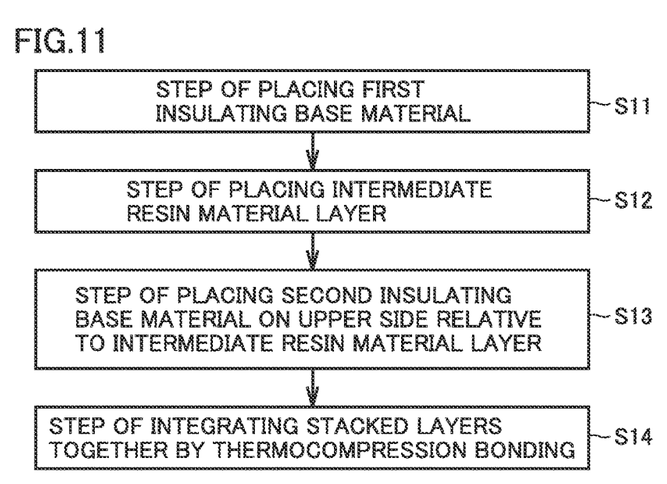
FIG. 11 is a flowchart for a method of manufacturing a resin multilayer substrate according to Preferred Embodiment 5 of the present invention.

With reference to FIG. 11, a method of manufacturing a resin multilayer substrate according to Preferred Embodiment 5 of the present invention is described. In the method of manufacturing a resin multilayer substrate according to the present preferred embodiment, the stacking is performed upside down and in the reverse order as compared to the case shown with reference to FIGS. 8-10 for Preferred Embodiment 4. In this case, first side 91 corresponds to the lower side, and second side 92 corresponds to the upper side. In this case, a first insulating base material, an intermediate resin material layer, and a second insulating base material are stacked in this order from the bottom. A flowchart for the method of manufacturing a resin multilayer substrate according to the present preferred embodiment is shown in FIG. 11. The method of manufacturing a resin multilayer substrate in this case can be expressed as follows.

The method of manufacturing a resin multilayer substrate according to the present preferred embodiment is a method of manufacturing a resin multilayer substrate by stacking a plurality of insulating base materials in sheet form in a stacking direction, the stacking direction being the direction connecting a first side and a second side opposite to the first side, each insulating base material including a thermoplastic resin as a main material and including a main surface on the first side and a main surface on the second side. The method includes a step S11 of placing a first insulating base material with the second side facing upward, the first insulating base material including a first conductor pattern formed on the main surface on the first side, a step S12 of placing an intermediate resin material layer on the upper side of the first insulating base material, a step S13 of placing a second insulating base material on the upper side relative to the intermediate resin material layer, the second insulating base material including a second conductor pattern formed on the main surface on the first side, and a step S14 of integrating the stack of the first insulating base material, the intermediate resin material layer, and the second insulating base material together by thermocompression bonding after the step of placing the second insulating base material. The intermediate resin material layer includes an intermediate region whose surface on the second side is in contact with the main surface on the first side of the second insulating base material, and an end region whose surface on the second side is in contact with the surface on the first side of the second conductor pattern. After step S12 of placing the intermediate resin material layer, the surface on the first side of the intermediate resin material layer is in contact with the main surface on the second side of the first insulating base material. At step S13 of placing the second insulating base material, the first conductor pattern extends over the intermediate region and the end region when seen in plan view.

This manufacturing method may also provide a configuration similar to the one obtained by the manufacturing method of Preferred Embodiment 4 and prevents, with the presence of intermediate resin material layer 8, a short circuit between the conductor patterns vertically adjacent to each other, i.e., first conductor pattern 71 and second conductor pattern 72. Preferable conditions and the like are similar to those described for Preferred Embodiment 4.

Note that, more than one of the above preferred embodiments may be combined as appropriate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin multilayer substrate comprising:
a plurality of insulating base materials in sheet form that are stacked in a stacking direction and integrated together by thermocompression bonding, the stacking direction being a direction connecting a first side and a second side opposite to the first side, each of the plurality of insulating base materials including a thermoplastic resin as a main material and including a main surface on the first side and a main surface on the second side; wherein
the plurality of insulating base materials include a first insulating base material including a first conductor pattern provided on the main surface on the first side, and a second insulating base material including a second conductor pattern provided on the main surface on the first side;
the second insulating base material, an intermediate resin material layer with no conductor pattern, and the first insulating base material are stacked in this order from the second side to the first side;
the intermediate resin material layer includes an intermediate region with a surface on the second side that is in contact with the main surface on the first side of the second insulating base material, and an end region with a surface on the second side that is in contact with a surface on the first side of the second conductor pattern;
a surface on the first side of the intermediate resin material layer is in contact with the main surface on the second side of the first insulating base material;
when seen in plan view, the first conductor pattern extends over the intermediate region and the end region; and
the first conductor pattern is displaced so as to be elevated towards the first side in a region in which the first conductor pattern overlaps the end region of the intermediate resin material layer.

2. The resin multilayer substrate according to claim 1, wherein the first insulating base material is thinner than the second insulating base material.

3. The resin multilayer substrate according to claim 1, wherein the first insulating base material is a thinnest of the plurality of insulating base materials.

4. The resin multilayer substrate according to claim 1, wherein the second conductor pattern is thicker than the first insulating base material.

5. The resin multilayer substrate according to claim 1, wherein a main material of the intermediate resin material layer is the same as the main material of the plurality of insulating base materials.

6. The resin multilayer substrate according to claim 1, further comprising:
one or more outside electrodes on an outermost surface on the first side or on the second side; wherein
when seen in plan view, the one or more outside electrodes are located so as to avoid a boundary portion between the intermediate region and the end region.

7. The resin multilayer substrate according to claim 1, wherein the intermediate resin material layer is in sheet form.

8. The resin multilayer substrate according to claim 1, wherein the intermediate resin material layer is made of a paste.

9. A method of manufacturing a resin multilayer substrate by stacking a plurality of insulating base materials in sheet form in a stacking direction, the stacking direction being a direction connecting a first side and a second side opposite to the first side, each of the plurality of insulating base materials including a thermoplastic resin as a main material and including a main surface on the first side and a main surface on the second side, the method comprising the steps of:
placing a second insulating base material with the first side facing upward, the second insulating base material including a second conductor pattern formed on the main surface on the first side;
placing an intermediate resin material layer on an upper side of the second insulating base material;
placing a first insulating base material on an upper side relative to the intermediate resin material layer, the first insulating base material including a first conductor pattern formed on the main surface on the first side; and
after the step of placing the first insulating base material, integrating a stack of the second insulating base material, the intermediate resin material layer, and the first insulating base material together by thermocompression bonding; wherein
the intermediate resin material layer includes an intermediate region with a surface on the second side that is in contact with the main surface on the first side of the second insulating base material, and an end region with a surface on the second side that is in contact with a surface on the first side of the second conductor pattern;
after the step of placing of the first insulating base material, a surface on the first side of the intermediate resin material layer is in contact with the main surface on the second side of the first insulating base material;
in the step of placing the first insulating base material, the first insulating base material is placed so that the first conductor pattern extends over the intermediate region and the end region when seen in plan view, and the first conductor pattern is displaced so as to be elevated to the first side in a region in which the first conductor pattern overlaps the end region of the intermediate resin material layer.

10. A method of manufacturing a resin multilayer substrate by stacking a plurality of insulating base materials in sheet form in a stacking direction, the stacking direction being a direction connecting a first side and a second side opposite to the first side, each of the plurality of insulating base materials including a thermoplastic resin as a main material and including a main surface on the first side and a main surface on the second side, the method comprising the steps of:
placing a first insulating base material with the second side facing upward, the first insulating base material including a first conductor pattern formed on the main surface on the first side;
placing an intermediate resin material layer on an upper side of the first insulating base material;
placing a second insulating base material on an upper side relative to the intermediate resin material layer, the second insulating base material including a second conductor pattern formed on the main surface on the first side; and
after the step of placing the second insulating base material, integrating a stack of the first insulating base material, the intermediate resin material layer, and the second insulating base material together by thermocompression bonding; wherein
the intermediate resin material layer includes an intermediate region with a surface on the second side that is in contact with the main surface on the first side of the second insulating base material, and an end region with a surface on the second side that is in contact with a surface on the first side of the second conductor pattern;
after the step of placing the intermediate resin material layer, a surface on the first side of the intermediate resin material layer is in contact with the main surface on the second side of the first insulating base material;
in the step of placing of the second insulating base material, the first conductor pattern extends over the intermediate region and the end region when seen in plan view; and
after the step of integrating, the first conductor pattern is displaced so as to be elevated to the first side in a region in which the first conductor pattern overlaps the end region of the intermediate resin material layer.

11. The method of manufacturing a resin multilayer substrate according to claim 9, wherein the first insulating base material is thinner than the second insulating base material.

12. The method of manufacturing a resin multilayer substrate according to claim 9, wherein the first insulating base material is a thinnest of the plurality of insulating base materials.

13. The method of manufacturing a resin multilayer substrate according to claim 9, wherein the second conductor pattern is thicker than the first insulating base material.

14. The method of manufacturing a resin multilayer substrate according to claim 9, wherein a main material of the intermediate resin material layer is the same as the main material of the plurality of insulating base materials.

15. The method of manufacturing a resin multilayer substrate according to claim 10, the method further comprising the step of:
placing an insulating base material including one or more outside electrodes on the main surface on the first side or on the second side, so that the one or more outside electrodes are exposed on an outermost surface of a stacked body; wherein
when seen in plan view, the one or more outside electrodes are located so as to avoid a boundary portion between the intermediate region and the end region.

16. The method of manufacturing a resin multilayer substrate according to claim 10, wherein the step of placing the intermediate resin material layer includes placing a layer in sheet form.

17. The method of manufacturing a resin multilayer substrate according to claim 10, wherein the step of placing the intermediate resin material layer includes forming the intermediate resin material layer by applying a paste.

18. The method of manufacturing a resin multilayer substrate according to claim 10, wherein the first insulating base material is thinner than the second insulating base material.

19. The method of manufacturing a resin multilayer substrate according to claim 10, wherein the second conductor pattern is thicker than the first insulating base material.

20. A resin multilayer substrate comprising:

a plurality of insulating base materials that are stacked in a stacking direction and integrated together by thermocompression bonding, the stacking direction being a direction connecting a first side and a second side opposite to the first side, each of the plurality of insulating base materials including a thermoplastic resin as a main material and including a main surface on the first side and a main surface on the second side; wherein two or more of the plurality of insulating base materials each include a conductor pattern provided on the main surface on the first side;

in at least a portion of an area in which the conductor patterns of two insulating base materials that are adjacent to each other in the stacking direction overlap each other, an intermediate resin material layer is provided between the conductor patterns, with an end portion of the intermediate resin material layer covering an end of a lower one of the conductor patterns, and the lower one of the conductor patterns is displaced so as to be elevated to the first side in a region in which the end portion of the intermediate resin material layer covers the end of the lower one of the conductor patterns; and in at least a portion of an area in which the conductor patterns of two insulating base materials adjacent to each other in the stacking direction do not overlap each other, an intermediate resin material layer is provided between the conductor patterns, with an end portion of the intermediate resin material layer not covering an end of a lower one of the conductor patterns.

* * * * *